United States Patent
Oshima et al.

(10) Patent No.: US 7,187,192 B2
(45) Date of Patent: *Mar. 6, 2007

(54) SEMICONDUCTOR TEST DEVICE HAVING CLOCK RECOVERY CIRCUIT

(75) Inventors: Hideyuki Oshima, Tokyo (JP); Yasutaka Tsuruki, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/512,296

(22) PCT Filed: Apr. 21, 2003

(86) PCT No.: PCT/JP03/05044

§ 371 (c)(1),
(2), (4) Date: Oct. 21, 2004

(87) PCT Pub. No.: WO03/091742

PCT Pub. Date: Nov. 6, 2003

(65) Prior Publication Data

US 2005/0156622 A1  Jul. 21, 2005

(30) Foreign Application Priority Data

Apr. 26, 2002  (JP) .............................. 2002-126551

(51) Int. Cl.
G01R 31/26 (2006.01)
G01R 31/28 (2006.01)
G01R 31/02 (2006.01)

(52) U.S. Cl. .................... 324/765; 324/158.1; 714/731; 714/744

(58) Field of Classification Search .................. 324/765; 714/731

See application file for complete search history.

(56) References Cited

U.S. PATENT DOCUMENTS

| 5,321,700 A | * | 6/1994 | Brown et al. ................ 714/743 |
| 5,717,704 A | * | 2/1998 | Rosenfeld .................... 714/736 |
| 6,553,529 B1 | * | 4/2003 | Reichert ...................... 714/738 |
| 2001/0052097 A1 | * | 12/2001 | Miura ......................... 714/744 |
| 2005/0080580 A1 | * | 4/2005 | Kantake ...................... 702/117 |
| 2005/0149801 A1 | * | 7/2005 | Oshima ....................... 714/731 |

FOREIGN PATENT DOCUMENTS

| JP | 56-16547 | 4/1981 |
| JP | 62-011181 | 1/1987 |
| JP | 63-148176 | 6/1988 |
| JP | 64-19827 | 1/1989 |
| JP | 01-164118 | 6/1989 |
| JP | 2000-314767 | 11/2000 |
| WO | WO97/04327 | 6/1997 |

* cited by examiner

*Primary Examiner*—Vinh Nguyen
*Assistant Examiner*—Emily Y Chan
(74) *Attorney, Agent, or Firm*—Muramatsu & Associates

(57) ABSTRACT

A semiconductor test device for acquiring a multiplexed clock signal from LSI output data and using the clock to test the LSI. The device includes a time interpolator and registers connected in series. The time interpolator has flip-flops connected in parallel for receiving output data from an LSI under test, a delay circuit for successively inputting strobes delayed at a constant timing interval to the flip-flops and outputting time-series level data, and an encoder for receiving the time-series level data from the flip-flops and encoding it into position data indicating an edge timing. The registers successively store position data from the encoder and output them at a predetermined timing. The device further includes a digital filter for outputting the position data from the registers as a recovery clock.

12 Claims, 7 Drawing Sheets

FIG. 5

| Judge Sel | Smoothing Sel | Edge Sel | Jitter Sel | Jitter Hits Sel | Data Clk Sel | Test item | DUT | Calculation equation | Edge fill type | Use purpose |
|---|---|---|---|---|---|---|---|---|---|---|
| ①Data Exp Mode | ①Smoothing Mode | ①Edge Sync Mide | **** | **** | **** | Function Test | Clock Enb | $\bar{X}_s \left(= \frac{1}{n}\sum_{i=1}^{n} X_i\right)$ | | Store position data (Xi) only of cycle in which edge can be detected |
| ①Data Exp Mode | ①Smoothing Mode | ②Continuously Mode | **** | **** | **** | Function Test | Clock Enb | $\bar{X}_c \left(= \frac{1}{n}\sum_{i=1}^{n} X_i\right)$ | | Store the same position data (Xi=Xi-1) as that of previous cycle with regard to cycle (Xi=FS) in which edge cannot be detected |
| ①Data Exp Mode | ②Sampling Mode | ②Continuously Mode | **** | **** | **** | Function Test | Clock Enb | $X_i$ | | Store the same position data (Xi=Xi-1) as that of previous cycle with regard to cycle (Xi=FS) in which edge cannot be detected |
| ①Data Exp Mode | **** | ①Edge Sync Mide | ①Cycle To Cycle Jitter | **** | **** | Jitter Test | Clock Enb | $X_i - X_{i-m}$ | | Store position data (Xi) only of cycle in which edge can be detected |
| ②Jitter Fail Mode | **** | ②Continuously Mode | ①Cycle To Cycle Jitter | **** | **** | Jitter Test | Clock Enb | $X_i - X_{i-m}$ | | Store the same position data (Xi=Xi-1) as that of previous cycle with regard to cycle (Xi=FS) in which edge cannot be detected |
| ②Jitter Fail Mode | **** | ①Edge Sync Mide | ②Cycle To Smoothing Jitter | **** | **** | Jitter Test | Clock Enb | $X_i - \bar{X}_s$ | | Store position data (Xi) only of cycle in which edge can be detected |
| ②Jitter Fail Mode | **** | ②Continuously Mode | ②Cycle To Smoothing Jitter | **** | **** | Jitter Test | Clock Enb | $X_i - \bar{X}_c$ | | Store the same position data (Xi=Xi-1) as that of previous cycle with regard to cycle (Xi=FS) in which edge cannot be detected |
| **** | **** | **** | **** | ①Data Clock Jitter | ②Data | Jitter Histogram | Source Sync/ Clock Enb | Data | | |
| **** | ①Smoothing Mode | ①Edge Sync Mide | **** | ①Data Clock Jitter | ①Data-Clk | Jitter Histogram | Clock Enb | $Data - \bar{X}_s$ | | Store position data (Xi) only of cycle in which edge can be detected |
| **** | ①Smoothing Mode | ②Continuously Mode | **** | ①Data Clock Jitter | ①Data-Clk | Jitter Histogram | Clock Enb | $Data - \bar{X}_c$ | | Store the same position data (Xi=Xi-1) as that of previous cycle with regard to cycle (Xi=FS) in which edge cannot be detected |
| **** | ②Sampling Mode | ②Continuously Mode | **** | ①Data Clock Jitter | ①Data-Clk | Jitter Histogram | Clock Enb | $Data - X_i$ | | Store the same position data (Xi=Xi-1) as that of previous cycle with regard to cycle (Xi=FS) in which edge cannot be detected |
| **** | **** | ①Edge Sync Mide | ①Cycle To Cycle Jitter | ②Clock Recovery Jitter | **** | Jitter Histogram | Clock Enb | $X_i - X_{i-m}$ | | Store position data (Xi) only of cycle in which edge can be detected |
| **** | **** | ②Continuously Mode | ①Cycle To Cycle Jitter | ②Clock Recovery Jitter | **** | Jitter Histogram | Clock Enb | $X_i - X_{i-m}$ | | Store the same position data (Xi=Xi-1) as that of previous cycle with regard to cycle (Xi=FS) in which edge cannot be detected |
| **** | **** | ①Edge Sync Mide | ②Cycle To Smoothing Jitter | ②Clock Recovery Jitter | **** | Jitter Histogram | Clock Enb | $X_i - \bar{X}_s$ | | Store position data (Xi) only of cycle in which edge can be detected |
| **** | **** | ②Continuously Mode | ②Cycle To Smoothing Jitter | ②Clock Recovery Jitter | **** | Jitter Histogram | Clock Enb | $X_i - \bar{X}_c$ | | Store the same position data (Xi=Xi-1) as that of previous cycle with regard to cycle (Xi=FS) in which edge cannot be detected |

上表のセレクタの設定を満たしていれば、Jitter Histgramは、Function TestやJitter Test と組み合わせて実施可能

SEMICONDUCTOR TEST DEVICE HAVING CLOCK RECOVERY CIRCUIT

TECHNICAL FIELD

The present invention relates to a semiconductor test device which compares output data output from an LSI to be measured with predetermined expected value data and which judges whether or not the LSI to be measured is satisfactory, particularly to a semiconductor test device preferable for a test of a data/clock multiplexed type LSI device which multiplexes and outputs a clock onto output data, represented by SERDES or the like.

BACKGROUND ART

In general, a semiconductor test device (LSI tester) for performing a function test of an LSI inputs a predetermined test pattern signal into an LSI to be measured which is a device under test (DUT), compares output data output from the LSI to be measured with a predetermined expected value pattern signal, judges agreement/disagreement, and accordingly detects/judges whether or not the LSI to be measured is satisfactory.

FIG. 6 is a block diagram showing a schematic constitution of a conventional general semiconductor test device.

As shown in the figure, a conventional LSI tester (semiconductor test device) 110 has: a level comparator 113 which compares a level of output data of the LSI to be measured (DUT) 101 with that of a comparison voltage; a pattern comparison unit 114 which compares the output data of the LSI to be measured 101 with a predetermined expected value; a flip-flop 121 for inputting the output data of the LSI to be measured 101 into the pattern comparison unit 114 at a predetermined timing.

In the conventional semiconductor test device constituted in this manner, first a predetermined test pattern signal is input into the LSI to be measured 101 from a pattern generation unit (not shown), and a predetermined signal is output as output data from the LSI to be measured 101. The output data output from the LSI to be measured 101 is input into the level comparator 113 of the LSI tester 110. The output data input into the level comparator 113 is compared with the level of the comparison voltage, and output to the flip-flop 121.

In the flip-flop 121, a signal from the level comparator 113 is held as input data, a strobe from a timing generation unit (not shown) is used as a clock signal, and output data is output at a predetermined timing. The output data output from the flip-flop 121 is input into the pattern comparison unit 114, and compared with a predetermined expected value data output from a pattern generation unit in the tester, and a comparison result is output.

Moreover, from this comparison result, it is detected whether or not the output data agrees with the expected value, and it is judged whether or not the LSI to be measured is satisfactory (Pass/Fail).

In this manner, in the conventional semiconductor test device (LSI tester), the output data output from the LSI to be measured is acquired at the timing of the strobe output at a predetermined timing in the tester, and this strobe has been a timing signal output from the timing generation unit disposed independently of the LSI to be measured. Additionally, in the conventional semiconductor test device which acquires the output data of the LSI to be measured by an independent timing signal output from this tester in this manner, there has occurred a problem that the test LSI device in which the clock is multiplexed onto the output data and output cannot be tested.

In recent years, speeding-up of the LSI has remarkably proceeded, and to speed up data transfer, a new LSI device represented by a serializer and deserializer (SERDES) or the like has been provided. The SERDES is an LSI device which converts parallel data into serial data or the serial data into the parallel data, a high-rate data transfer is possible, and the device is used as an interface or the like of data communication. Moreover, in the LSI such as the SERDES, for example, when the parallel data is converted into the serial data and output, the clock is multiplexed onto the output data in the LSI, and the output data is output at an edge timing of the multiplexed clock.

Therefore, to perform the test of the LSI device in which the clock is multiplexed onto the output data in this manner, the output data to be compared with the expected value data needs to be acquired at the timing of the multiplexed clock. However, in the conventional semiconductor test device, as described above, since the output data output from the LSI to be measured is acquired by the timing signal output from the timing generation unit independent of the LSI to be measured, it has been impossible to acquire the output data at the timing of the clock of the LSI to be measured.

Therefore, in the conventional semiconductor test device, it has been impossible to correctly test the LSI of the clock/data multiplexed type from which the output data with the clock multiplexed thereon is output.

Here, as a method of testing the LSI in which the clock is multiplexed onto the data, as in an LSI tester 210 shown in FIG. 7, it is considered that a test terminal ("CKO" shown in the figure) for outputting the clock, separate from an output terminal of the output data ("Q" shown in the figure), is disposed in an LSI to be measured (DUT) 201 into which a test signal is input from a pattern generator (PG) 211 via a waveform forming unit (format controller: FC) 212, and a clock signal is output from this test terminal, and input into a pattern comparison unit (digital compare: DC) 214, a fail analysis memory (data failure memory: DFM) 215 and the like.

However, when the test terminal for the clock output, which has not been originally disposed, is disposed in the LSI to be measured in this manner, a device constitution is changed for the test, the number of pins increases by the test terminal for use only in the test, and it has been actually difficult to adopt the terminal.

Moreover, in the output data output from the LSI to be measured, for example, a signal becomes HIGH (or LOW) over two or more clock cycles, the signal does not necessarily change at the edge timing of the clock, and an operation waveform is not the same as that of the multiplexed clock. Therefore, when the output data is simply acquired, it is difficult to correctly retrieve the edge timing of the multiplexed clock, and the output data cannot be synchronized with the clock at a correct timing.

That is, to perform the test using the clock multiplexed onto the output data, it is necessary to dispose a certain function (source synchronous function) for synchronizing the multiplexed clock with the edge timing of the output data. When the terminal for outputting the clock is simply disposed in the LSI to be measured to output the clock as shown in FIG. 7, the clock/data multiplexed type LSI cannot be correctly tested.

Furthermore, the clock output from the LSI to be measured generally has a jitter (irregular fluctuation of the timing), and the edge timing fluctuates by the jitter. Therefore, when the test terminal is simply disposed to take out the clock, the output data is taken in at the timing of the clock which has fluctuated by the jitter, and there has also been a problem that a correct test result cannot be obtained.

In the method in which the test terminal for outputting the clock is disposed in the LSI to be measured in this manner, it has been impossible to test a clock/data multiplexed type LSI such as SERDES in which the clock is multiplexed onto the output data.

The present invention has been proposed in order to solve the above-described problem of the conventional technique, and an object thereof is to provide a semiconductor test device comprising a clock recovery circuit having a source synchronous function capable of taking a multiplexed clock signal from output data of an LSI to be measured to adequately correct an edge timing of the clock signal while synchronizing the output data, so that the clock signal multiplexed onto the output data can be easily and securely acquired without using any timing signal from the outside or without disposing any extra output terminal or the like in the LSI to be measured, and the output data of the LSI to be measured can be correctly retrieved by a recovery clock corrected at a proper edge timing.

DISCLOSURE OF THE INVENTION

To achieve the object, according to the present invention, there is provided a semiconductor test device comprising: a clock recovery circuit having a time interpolator which inputs output data output from an LSI which is a device under test and which acquires the output data by a plurality of strobes having constant timing intervals to output time-series level data and which outputs position data indicating an edge timing of the level data, and a digital filter which inputs and holds the position data output from this time interpolator and which outputs a recovery clock indicating a predetermined edge timing from one or more position data.

According to the semiconductor test device of the present invention constituted in this manner, first the time interpolator is disposed as the clock recovery circuit having a source synchronous function, and accordingly the output data onto which a clock output from the LSI to be measured is multiplexed can be acquired as the time-series level data. This time-series level data indicates the edge timing which is a signal change point of the output data of the LSI to be measured, and this edge timing indicates an edge timing of the clock multiplexed onto the output data. Therefore, when the output data of the LSI to be measured is input into the time interpolator, and the level data and position data indicating the edge timing are acquired, the clock multiplexed onto the output data can be taken out.

Moreover, in the present invention, since the clock recovery circuit further comprises the digital filter, the position data output from the time interpolator is held and stored, and can be output as the recovery clock corrected at a correct and adequate edge timing. In the time interpolator, the level data and position data indicating the edge timing of the output data can be acquired. However, for example, when there is not any change in the output data over several clocks, the signal change point (rising edge or falling edge) is not detected. As a result, the timing edge of the clock multiplexed onto the output data cannot be acquired. The output data has a jitter, and the edge timing indicated by the acquired level data and position data is not a proper timing as a timing signal for acquiring test data.

Then, when the position data acquired by the time interpolator is input and stored in the digital filter, the data can be output as the corrected recovery clock at a timing correctly and properly indicating the edge timing of the multiplexed clock. Accordingly, the recovery clock indicating the proper edge timing of the multiplexed clock can be output in a case where the edge of the output data of the LSI to be measured or a case where the output data has fluctuated by the jitter.

Therefore, according to the clock recovery circuit of the present invention, it is possible to realize a source synchronous function capable of taking out the clock signal multiplexed onto the output data of the LSI to be measured, and acquiring a proper recovery clock which is not influenced by presence of the edge of the output data or the jitter to take in the output data of the LSI to be measured using this recovery clock, and an LSI of a clock/data multiplexed type such as SERDES can be easily and correctly tested.

Moreover, concretely, in the semiconductor test device of the present invention, the time interpolator comprises: a plurality of sequential circuits, connected in parallel, which input the output data output from the LSI; a delay circuit which successively inputs a strobe delayed at a constant timing interval into the plurality of sequential circuits and which outputs time-series level data from the sequential circuits; and an encoder which inputs the time-series level data output from the plurality of sequential circuits and which encodes the data into position data indicating the edge timing of the output data of the LSI to output the data, the digital filter comprises: one or more registers connected in series, which successively store the position data output from the time interpolator and which output the stored position data at a predetermined timing, and the recovery clock indicating the predetermined edge timing is output from one or more position data output from this register.

In this manner, the time interpolator and the digital filter of the present invention can be easily constituted using existing means such as a sequential circuit, a delay circuit, an encoder, a register and the like. Accordingly, the semiconductor test device comprising the clock recovery circuit according to the present invention can be realized by the simple constitution without complicating or enlarging the LSI tester or increasing the costs.

Moreover, according to the clock recovery circuit of the present invention constituted of the sequential circuit, the delay circuit and the register in this manner, when the number of the sequential circuits or the registers, and a delay amount of the delay circuit are changed, a bit width (the number of the sequential circuits, the registers) of the test signal level data or position data in the time interpolator and the digital filter, or resolution. (the delay amount of the delay circuit) can be set to arbitrary values. Accordingly, it is possible to realize a semiconductor test device in which various settings are possible in accordance with a data rate, a jitter width and the like and which has general-purpose properties capable of coping with any LSI, and high convenience.

It is to be noted that the sequential circuit or the register disposed in the time interpolator and the digital filter can be easily constituted using existing circuits such as a flip-flop and a latch. As long as the output data from the LSI to be measured can be acquired at the constant timing interval and output as the time-series level data, or the position data indicating the edge timing can be held, stored, and output at the predetermined timing, any circuit constitution may be used instead of the flip-flop or the latch.

Moreover, in the semiconductor test device of the present invention, the digital filter comprises: an edge detection circuit which detects presence of an edge of the position data input from the time interpolator and which outputs the position data stored in the register in a case where the edge is detected.

Since this edge detection circuit is disposed, the only position data whose edge indicating the signal change point has been detected among the position data acquired by the time interpolator can be stored as the position data constituting a reference of the recovery clock into the register, and output. As to the position data acquired by the time interpolator, for example, when there is not any change in the output data over several clocks, the signal change point (rising edge or falling edge) is not detected, and therefore the timing edge of the clock multiplexed onto the output data cannot be acquired.

Then, in the present invention, the edge detection circuit which detects the presence of the edge of the acquired position data is disposed, accordingly the position data whose edge has been detected is stored into the register, and the recovery clock is output based on the position data. Accordingly, the recovery clock can be stably output even in a case where the edge of the output data of the LSI to be measured is not detected.

Moreover, the recovery clock is output based on the only position data whose edge has been detected. Accordingly, for example, even when an average value of the acquired position data is obtained and output as the recovery clock, the recovery clock indicating the correct timing reflecting the actual edge timing of the output data can be output, and it is possible to perform a more accurate semiconductor test with high reliability.

Furthermore, the semiconductor test device of the present invention can be constituted in such a manner that the register outputs the stored position data at the predetermined timing regardless of the presence of the edge of the position data, detected by the edge detection circuit.

By this constitution, even in a case where the edge indicating the signal change point of the position data acquired by the time interpolator is not detected, the position data of the previous cycle, already stored in the register, can be output at the predetermined timing, and the recovery clock can be output based on the position data of the previous cycle. The only position data whose edge has been detected can be stored as the reference of the recovery clock in the register among the position data output from the time interpolator as described above. However, in a case where the edge of the position data is not detected over several clocks, the position data which can be acquired decreases, and a period in which the position data can be acquired is not constant. Therefore, for example, when the average value of a plurality of position data is obtained to output the recovery clock, a large number of registers need to be disposed in order to output a correct recovery clock.

Then, in the present invention, in the case where the edge of the acquired position data is not detected, the position data whose edge stored already in the previous cycle has been detected is output from the register, and the recovery clock is output based on the position data. Accordingly, in the present invention, the edge timing of the actually acquired position data is reflected, the period for acquiring the position data is set to be constant, the number of the installed registers can be optimized, and a semiconductor test device having a high reliability can be realized with a simple constitution without complicating or enlarging the tester constitution or increasing the costs.

Furthermore, the semiconductor test device of the present invention can be constituted in such a manner that the digital filter comprises an edge selector which selects whether or not to output the position data stored in the register regardless of the presence of the edge of the position data, detected by the edge detection circuit.

Since the edge selector is disposed, it can be selected whether or not to output the position data of the previous cycle, stored in the register, as the reference of the recovery clock in the case where the edge of the position data from the time interpolator is not detected. Accordingly, for example, when a stricter function test, jitter analysis or the like is performed by the use of the only actual edge timing of the output data of the LSI to be measured, the only position data whose edge has been detected is selected. When a logic test to inspect the output data itself of the LSI to be measured from an average value in a certain period is performed, the already stored position data of the previous cycle is also used. In this manner, the position data can be selectively adopted in accordance with test contents or the like, and it is possible to provide a semiconductor test device superior in general-purpose properties and expandability.

Moreover, the semiconductor test device of the present invention can be constituted in such a manner that in a case where two or more registers are disposed, the digital filter comprises an average value calculation circuit for inputting position data output from the two or more registers, respectively, and calculating an average value of edge timings indicated by the respective position data to output the average value as the recovery clock.

Since the digital filter comprises the plurality of registers and the average value calculation circuit for inputting the position data of the respective registers, the position data output from the time interpolator are stored in the plurality of registers, and the average value of the plurality of position data is calculated, and can be output as the recovery clock indicating the edge timing of the clock multiplexed onto the output data of the LSI to be measured. Accordingly, the average value of the edge timings indicated by the plurality of position data can be used as the recovery clock according to the present invention, and the correct and proper timing signal reflecting the actual output data of each LSI to be measured and the edge timing of the clock can be obtained. The recovery clock correctly indicating the edge timing of the clock of the LSI to be measured can be acquired even in the case where the edge of the output data is not detected or the case where the output data fluctuates by the jitter.

Moreover, the semiconductor test device of the present invention can be constituted in such a manner that the digital filter comprises an average value selector for selecting one of the position data output from one of the two or more registers and the average value output from the average value calculation circuit to output the recovery clock.

Since this average value selector is disposed, the position data output from a specific register and the average value of the position data of the plurality of registers can be selectively switched and output as the recovery clock output from the digital filter. Accordingly, the average value of the plurality of registers is output as the recovery clock, for example, in a case where the function test of the LSI to be measured is performed in consideration of the timing fluctuation by the jitter of the output data. The position data output from one of the plurality of registers is used as the recovery clock in a case where the logic test to inspect the output data itself of the LSI to be measured is performed regardless of the timing fluctuation by the jitter. The recovery clock can be selectively used in accordance with test contents and the like in this manner, and a semiconductor test device more superior in the general-purpose properties and expandability can be realized.

Moreover, the semiconductor test device of the present invention can be constituted in such a manner that the digital filter comprises a timing correction circuit for adding a predetermined correction value to the position data output from the register, and correcting the edge timing indicated by the position data to output the recovery clock.

Since the timing correction circuit is disposed in this manner, a set value (corrected value) taking into account a setup time, a holding time or the like is added to the position data output from one register or the average value of the position data output from two or more registers, and recovery clock corrected into the proper edge timing can be output. In general, the setup time (or the holding time) of the output data with respect to the clock needs to be considered in order to stably acquire the output data by the clock signal.

Then, in the present invention, the timing correction circuit is disposed which adds the set value of the setup time or the holding time to the position data output from the register of the digital filter, and accordingly the recovery clock corrected into the proper edge timing taking into account the setup time or the holding time of the output data can be output. Accordingly, the time-series level data output from the time interpolator can be acquired by the recovery clock corrected into a more proper timing can be acquired, and a further accurate semiconductor test device with high reliability can be provided.

Furthermore, the semiconductor test device of the present invention comprises a selection circuit which selects one data from the time-series level data output from the time interpolator using the recovery clock output from the digital filter as a selection signal to output the data as data to be tested for judging whether the LSI passes or fails.

By this constitution, the selection circuit is disposed which inputs the recovery clock as the selection signal, and accordingly the time-series level data acquired by the time interpolator can be selected and output as data to be measured for a function test in which the data is compared with predetermined expected value data to judge whether the data passes or fails.

Accordingly, it is possible to realize a source synchronous function capable of taking out the clock signal multiplexed onto the output data of the LSI to be measured, and taking in the output data of the LSI to be measured at the timing of the proper recovery clock which is not influenced by the presence of the edge of the output data or the jitter. Therefore, the present invention can be used as the test device for the function test of the LSI to be measured, and especially a function test of a clock/data multiplexed type LSI such as SERDES for multiplexing the clock onto the output data to output the clock, which has heretofore been difficult to perform or impossible, can be easily and accurately performed.

On the other hand, the semiconductor test device of the present invention comprises a jitter detection circuit which inputs a plurality of recovery clocks output from the digital filter and which detects a phase difference between the edge timings indicated by the respective recovery clocks to acquire the jitter of the output data of the LSI.

The device can also comprise a jitter distribution circuit which inputs the phase difference of the recovery clock detected by the jitter detection circuit and which acquires a distribution of the phase difference to output distribution data of the jitter of the output data of the LSI.

Since the jitter detection circuit for inputting a plurality of recovery clocks is disposed in this manner, the position data indicating the edge timing of each recovery clock is subtracted, and accordingly the phase difference between the recovery clocks can be detected. Since the jitter distribution circuit for inputting this phase difference is disposed, the distribution of the phase differences is acquired, and can be output as distribution data indicating fluctuations or spreads of the phase differences. The phase difference of the recovery clock indicates the jitter of the clock signal multiplexed onto the output data of the LSI to be measured, thus, by acquiring the phase differences of the recovery clocks and the distribution data, it is possible to perform jitter analysis of the output data of the LSI to be measured and the multiplexed clock.

Accordingly, in the present invention, the jitter analysis of the output data of the LSI to be measured and the clock can be easily, correctly, and securely performed with high precision without causing problems as arises when using an existing jitter measuring unit, such as an error by an operation of an oscilloscope or the like or difficulty in a measuring operation.

Additionally, the semiconductor test device of the present invention can comprise a jitter distribution circuit which inputs position data output from the time interpolator and a recovery clock corresponding to the position data output from the digital filter and which detects a phase difference between edge timings indicated by the position data and the recovery clock and which acquires a distribution of the phase differences to output the distribution as distribution data of jitters of output data of the LSI.

By this constitution, the phase difference between the recovery clock and the position data constituting original position data is input, and the distribution of the phase differences can be acquired and analyzed. The edge timing indicated by the recovery clock according to the present invention is position data in which the clock multiplexed onto the output data of the LSI to be measured is corrected into a proper timing. The recovery clock is compared with the original position data to acquire the distribution of the phase differences, and accordingly it is possible to analyze the jitter distribution of the output data of the LSI to be measured in comparison with the proper recovery clock.

Accordingly, in the present invention, the jitter distribution of the output data of the LSI to be measured can be easily and correctly analyzed without separately using a device or an apparatus such as a jitter measuring unit.

Here, for example, the above-described jitter distribution circuit can comprise: a decoder which decodes the position data indicating the input phase difference; and a counter which counts output signals of the decoder for each output terminal. In this case, the phase difference between the recovery clocks or that between the recovery clock and the original position data is output for each output terminal of the decoder, and the jitter distribution indicated by the phase difference can be counted by the counter. Accordingly, for example, data output from the counter is read and formed into a graph, and accordingly histogram or the like indicating the distribution of the jitter of the recovery clock can be easily and correctly acquired.

It is to be noted that in the present invention, the jitter distribution circuit which acquires the jitter distribution between the recovery clocks, and the jitter distribution circuit which acquires the jitter distribution between the recovery clock and the original position data can be constituted as a single (identical) jitter distribution circuit. In this case, selection means such as a selector is disposed, and the recovery clock which acquires the jitter distribution between the recovery clocks and the jitter distribution circuit which acquires the jitter distribution between the original position data can be selectively switched. Accordingly, the jitter distribution between the recovery clocks, and that between the recovery clock and the original position data can be selectively acquired and analyzed, it is possible to selectively adopt the position data depending upon the test contents and the like, and a semiconductor test device further superior in general-purpose properties and expandability can be realized.

BRIEF DESCRIPTION OF THE DRAWINGS

FIG. 5 is a table showing a combination of various types of tests which can be performed by switching of selectors in the semiconductor test device according to the second embodiment of the present invention;

BEST MODE FOR CARRYING OUT THE INVENTION

Preferable embodiments of a semiconductor test device according to the present invention will be described hereinafter with reference to the drawings.

First Embodiment

First, a first embodiment of a semiconductor test device according to the present invention will be described with reference to FIGS. 1 to 3.

Figure 1:
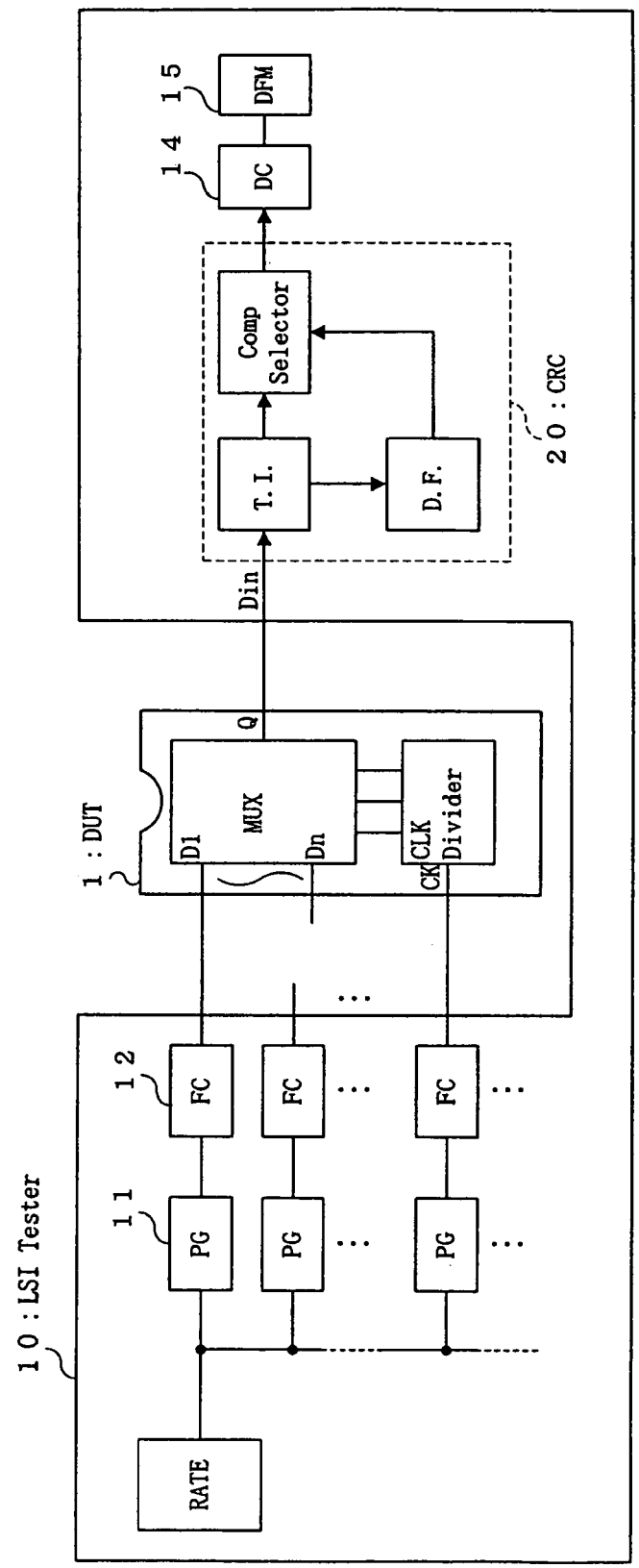
FIG. 1 is a block diagram showing a whole schematic constitution of a semiconductor test device according to a first embodiment of the present invention.

FIG. 1 is a block diagram showing a whole schematic constitution of the semiconductor test device according to the first embodiment of the present invention.

As shown in FIG. 1, the semiconductor test device according to the present embodiment comprises an LSI tester 10 which performs a function test of an LSI to be measured (DUT) 1, and the LSI tester 10 acquires output data output from the LSI 1 to be measured as data to be measured, and compares this data with a predetermined expected value data to thereby judge whether the LSI 1 to be measured passes or fails.

Here, the LSI 1 to be measured constitutes a clock/data multiplexed type LSI which multiplexes a clock signal onto the output data to output the data, represented, for example, by SERDES or the like. Moreover, in the present embodiment, the output data output from this clock/data multiplexed type LSI 1 to be measured is input into the LSI tester 10, accordingly a clock multiplexed onto the output data is taken out, and the output data is acquired at a timing of the taken clock, and can be output as the data to be measured.

[LSI Tester]

Figure 6:
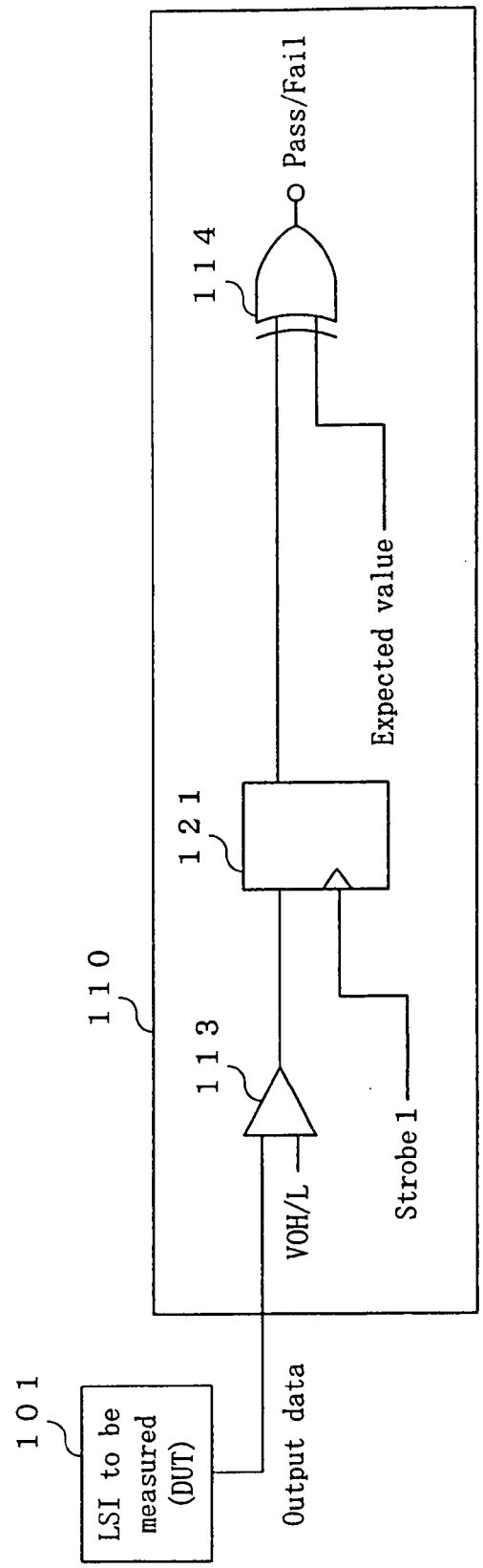
FIG. 6 is a block diagram showing a schematic constitution of a conventional general semiconductor test device.
Figure 7:
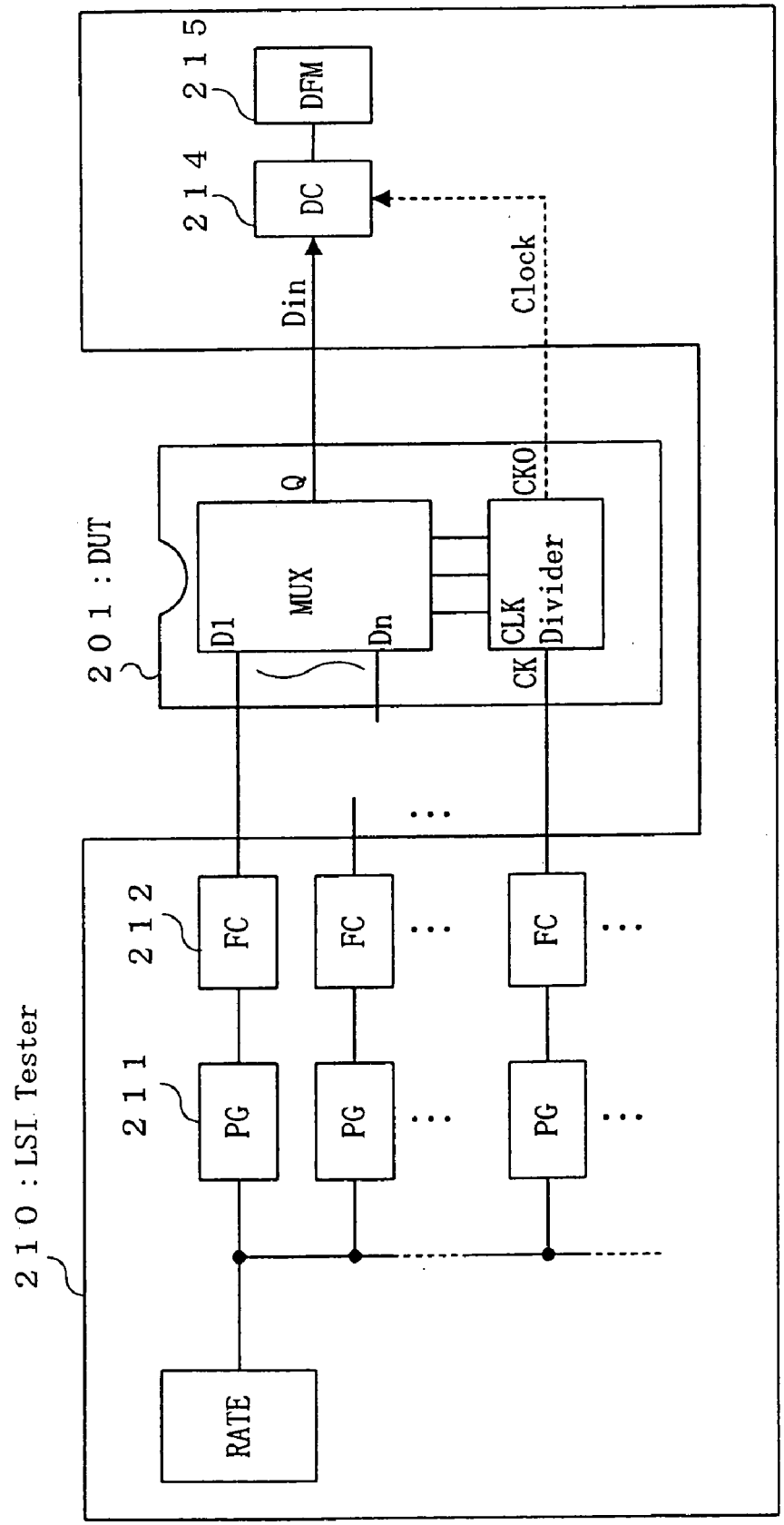
FIG. 7 is a block diagram showing a schematic constitution of another conventional semiconductor test device.

In the same manner as in a conventional LSI tester (see FIGS. 6 and 7), an LSI tester 10 constitutes a function test device of an LSI, which inputs test signals into an LSI 1 to be measured from pattern generators (PGs) 11 via waveform forming units (format controllers: FCs) 12 and which inputs output data output from the LSI 1 (DUT) to be measured into a pattern comparison unit (digital compare: DC) 14, a failure analysis memory (data failure memory: DFM) and the like to judge whether the LSI passes/fails.

Moreover, as shown in FIG. 1, the LSI tester 10 of the present embodiment comprises a clock recovery circuit (CRC) 20 which inputs the output data of the LSI 1 to be measured, and inputs the output data of the LSI 1 to be measured via this clock recovery circuit 20.

[Clock Recovery Circuit]

Figure 2:
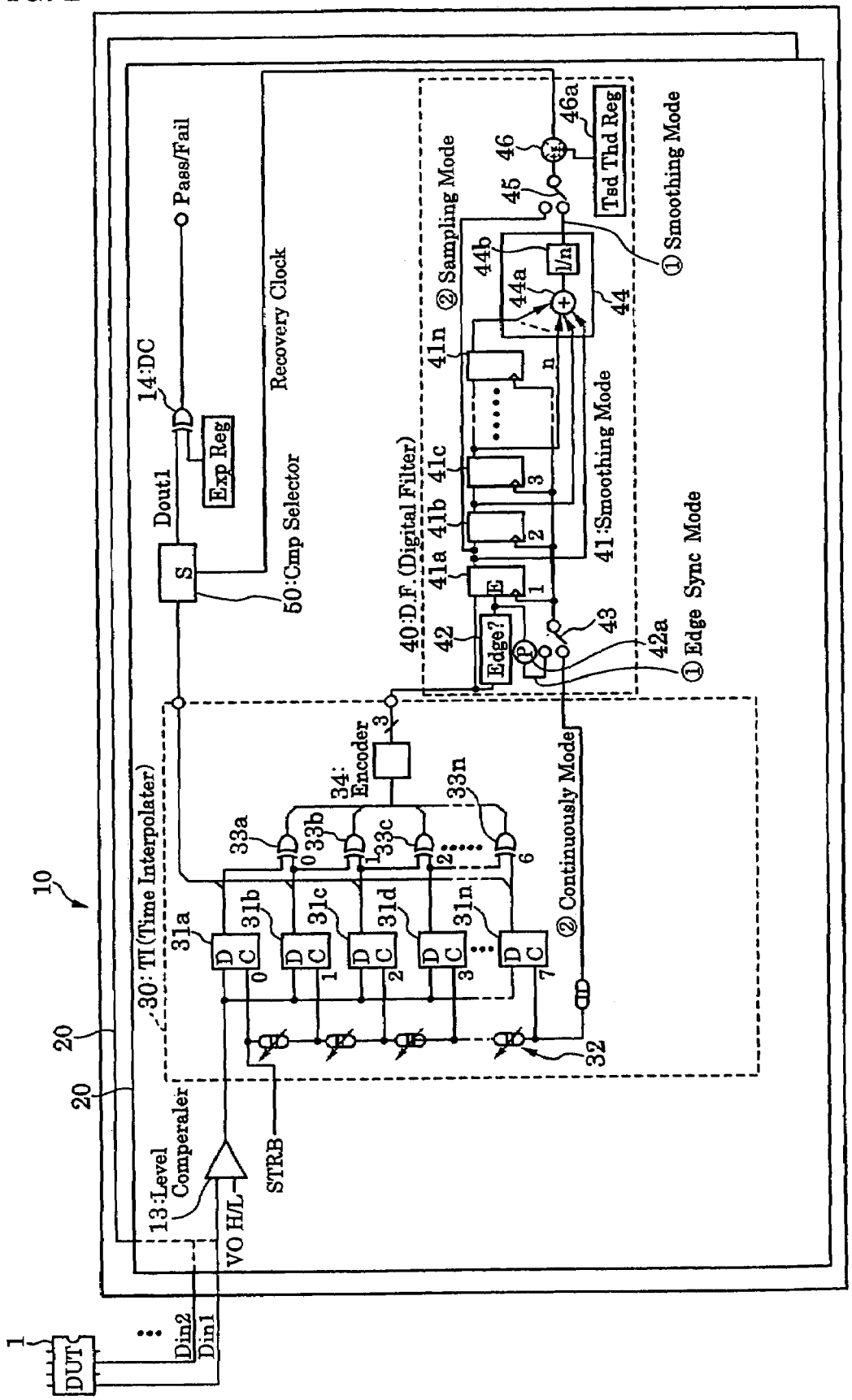
FIG. 2 is a block diagram showing details of a clock recovery circuit disposed in the semiconductor test device according to the first embodiment of the present invention.

FIG. 2 is a block diagram showing details of the clock recovery circuit 20 disposed in the LSI tester 10.

The clock recovery circuit 20 shown in the figure acquires the output data of the LSI 1 to be measured with a plurality of strobes having constant timing intervals, respectively, outputs the data as time-series level data, and acquires a predetermined recovery clock indicating an edge timing of a clock multiplexed onto the output data using the time-series level data. Moreover, the source synchronous function is realized which is capable of selecting and acquiring the output data of the LSI 1 to be measured at the timing of this recovery clock to take in the output data onto which the clock is multiplexed at the timing of the multiplexed clock.

First, as to the clock recovery circuit 20, each of the clock recovery circuits 20 having the same constitutions is assigned to each output data output from the LSI 1 to be measured. In the present embodiment, as shown in FIG. 1, one to n clock recovery circuits 20 are disposed for the terminal of the output data of the LSI 1 to be measured.

As shown in FIG. 1, each clock recovery circuit 20 have the same constitution, and concretely comprises: a level comparator 13; a pattern comparison unit 14; further a time interpolator (T.I.) 30; a digital filter (D.F.) 40; and a selector (Comp Selector) 50.

The level comparator 13 inputs an output signal (output data onto which the clock has been multiplexed in the present embodiment) from the LSI 1 to be measured, compares a level of the signal with that of a predetermined comparison voltage, and outputs a signal to the time interpolator 30 in the same manner as in the conventional LSI tester.

The pattern comparison unit 14 compares the output data of the LSI 1 to be measured selected by the selector 50 via the time interpolator 30 and digital filter 40 described later with a predetermined expected value to output a test result. It is to be noted that the test result output from the pattern comparison unit 14 is stored in a failure analysis memory 15 (not shown) (see FIG. 1) in the same manner as in a usual LSI tester.

[Time Interpolator]

A time interpolator 30 acquires output data output from an LSI 1 to be measured by a plurality of strobes having constant timing intervals to output the data as time-series level data.

Concretely, the time interpolator 30 comprises: a plurality of flip-flops 31a to 31n constituting sequential circuits; a delay circuit 32; exclusive OR (XOR) circuits 33a to 33n; and an encoder 34.

The plurality of flip-flops 31a to 31n are constituted of D-type flip-flop groups connected in parallel in the present embodiment, and input output signals (output data onto which the clock is multiplexed) output from the LSI to be measured via the level comparator 13 as input data. Moreover, the input data is output at a predetermined timing using the strobe input via the delay circuit 32 as the clock signal.

The delay circuit 32 successively inputs the strobe delayed at a constant timing interval into clock terminals of the plurality of flip-flops 31a to 31n, and outputs time-series level data from the flip-flops 31a to 31n.

Here, the number of the plurality of flip-flops 31a to 31n and a delay amount of the delay circuit 32 can be arbitrarily set and changed, and a bit width (the number of the sequential circuits) or a resolution (the delay amount of the delay circuit) of the time-series level data acquired in the time interpolator 30 can be set to a desired value. Accordingly, the acquired time-series level data can be variously set in accordance with a data rate, a jitter width and the like of the LSI 1 to be measured which is a device under test, and any LSI can be handled.

In the present embodiment, as shown in FIG. 2, "0 to 7" eight flip-flops 31a to 31n are disposed, and level data of eight bits in total is output by the strobe of the delay circuit 32.

It is to be noted that as to the strobes input into the flip-flops 31a to 31n via the delay circuit 32, an input timing for each output data output from the LSI 1 to be measured can be arbitrarily set, and may be varied for each output data.

In the present embodiment, since each clock recovery circuit 20 has the same constitution, the timing generation unit or the like is disposed for each clock recovery circuit 20, and accordingly the strobes can be independently input into each output data of the LSI 1 to be measured. Accordingly, the timing can be adjusted into an appropriate timing in accordance with the jitter or the like of the output data output from the LSI 1 to be measured.

With regard to each output data output from the LSI 1 to be measured, a phase is not constantly matched, and, for example, the setup time may be minus or plus in some case. Therefore, when the timing of the strobe is set for each output data, adjustment can be made in such a manner that the strobe is output to each output data at an optimum timing.

Moreover, the time-series level data output from the plurality of flip-flops 31a to 31n is input into the encoder 34 via the XOR circuits 33a to 33n, and the level data is encoded. Moreover, the time-series level data is input as input data of the selector 50 as such.

Concretely, first, the time-series level data output from the flip-flops 31a to 31n are input into the XOR circuits 33a to 33n.

Each of the XOR circuits 33a to 33n is a 2-input XOR circuit, and inputs the output data of two adjacent flip-flops 31 (31a and 31b, 31b and 31c, 31c and 31d, ... ) as shown in FIG. 2. In the present embodiment "0 to 6" seven XOR circuits 33a to 33n which input the output data of the eight flip-flops 31a to 31n are disposed (see FIG. 2).

Moreover, the data output from the XOR circuits 33a to 33n are input into the encoder 34.

Into the encoder 34, the output data from the flip-flops 31a to 31n are successively input via the XOR circuits 33a to 33n at constant intervals, encoding is performed at a timing at which the data from all the flip-flops 31a to 31n are put together, and the result is output.

Accordingly, the time-series level data output from the flip-flops 31a to 31n are output as encoded position data.

Moreover, when the position data encoded by the encoder 34 is input into the digital filter 40, the data is output as a recovery clock indicating the edge timing of the clock multiplexed onto the output data of the LSI 1 to be measured.

It is to be noted that the encoder 34 of the present embodiment encodes seven bits of level data input from the XOR circuits 33a to 33n into three bits of position data to output the data as shown in FIG. 2.

Moreover, the time-series level data output from the flip-flops 31a to 31n are input as input data into the selector 50 as such (see FIG. 2).

Furthermore, one data is selected from the level data input into the selector 50 by the recovery clock output from the digital filter 40, and one selected data is output as data to be measured of the LSI 1 to be measured.

[Digital Filter]

A digital filter 40 inputs and holds position data output from an encoder 34 of a time interpolator 30, and outputs a recovery clock indicating a predetermined edge timing from one or more position data.

Concretely, the digital filter 40 comprises: a plurality of registers (Smoothing Reg) 41 (41a to 41n); an edge selector 43; an average value calculation circuit 44; an average value selector 45; and a timing correction circuit 46.

As shown in FIG. 2, the plurality of registers 41a to 41n are constituted of the predetermined number (one to n) of register groups connected in series, successively store the position data output from the encoder 34 of the time interpolator 30, and output the stored position data at a predetermined timing.

Since the encoder 34 outputs three bits of position data in the present embodiment, the respective registers 41a to 41n input and store three bits of position data. Moreover, a predetermined trigger signal is input, and accordingly three bits of stored position data are output.

Concretely, in the registers 41a to 41n, first the position data of the encoder 34 is input and stored into the register 41a of a forefront stage, and the position data is output at a predetermined timing, and successively input into the registers 41b to 41n of subsequent stages connected in series. The position data output from the register n of a last stage is input into the average value calculation circuit 44 described later.

Moreover, the position data output from the respective registers 41a to 41n are input into the register of the next stage, and are also input into the average value calculation circuit 44. Accordingly, in the average value calculation circuit 44, the average value of edge timings indicated by the position data of the respective registers 41a to 41n is calculated.

Furthermore, the position data output from the register 41a of the forefront stage is also input into the average value selector 45 described later. Accordingly, one of the average value of the position data output from the average value calculation circuit 44 and the position data output from the register 41a of the forefront stage is selected.

It is to be noted that the number of the registers 41a to 41n according to the present embodiment can be arbitrarily set or changed, and the number of the position data which can be acquired, and the resolution of the average value of the position data can be adjusted in accordance with the number of the registers 41a to 41n. That is, as to the registers 41a to 41n, at least one register 41a which inputs the position data output from the time interpolator may be disposed, and the optimum number of the registers can be disposed in accordance with a data rate, jitter width and the like of the LSI 1 to be measured which is the device under test.

An edge detection circuit 42 detects the presence of the edge of the position data input from the encoder 34 of the time interpolator 30. Moreover, when the edge is detected, the position data whose edge has been detected is stored in the register 41a of the forefront stage, and the position data already stored in the respective registers 41a to 41n are output.

Any signal change point (rising edge or falling edge) does not exist in the position data acquired by the time interpolator 30, for example, in a case where there is not any change over several clocks, and therefore any edge timing is not indicated in the position data. Therefore, even when the position data are stored in the registers 41a to 41n, the edge timing edge of the clock multiplexed onto the output data indicated by the position data cannot be acquired.

Therefore, in the present embodiment, the edge detection circuit 42 for detecting the presence of the edge of the position data acquired by the encoder 34 is disposed, accordingly the only position data whose edge has been detected are successively stored in the registers 41a to 41n, and output, and the recovery clock is acquired based on the position data.

Concretely, the edge detection circuit 42 inputs the position data from the encoder 34, and detects the presence of the edge of the position data. Moreover, in a case where the edge of the position data is detected, an enable signal ("E" shown in FIG. 2) is output to the register 41a of the forefront stage, and the register 41a of the forefront stage is brought into a data inputtable stage. Accordingly, the position data whose edge has been detected is stored in the register 41a of the forefront stage.

On the other hand, when the edge of the position data is not detected, the edge detection circuit 42 does not output the enable signal. Therefore, in a case where any edge of the position data is not detected, the register 41a of the forefront stage is brought into an input impossible stage, and the position data whose edge is not detected is not stored in the register 41a. Moreover, the edge detection circuit 42 further inputs the enable signal into a pulser 42a ("P" shown in FIG. 2), converts the signal into trigger signals to be input into the respective registers 41a to 41n, inputs this trigger signal into each of the registers 41a to 41n, and outputs the position data stored in the registers 41a to 41n at predetermined timings.

Accordingly, among the position data acquired by the time interpolator 30, the only position data whose edge indicating the signal change point has been detected is stored as the position data constituting the reference of the recovery clock in the registers 41a to 41n, and output. Moreover, when any edge of the position data is not detected, the edge of the position data is detected in the subsequent cycle, and accordingly the position data stored in the respective registers 41a to 41n are output.

Since this edge detection circuit 42 is disposed, even in a case where any edge of the output data of the LSI 1 to be measured is not detected, the recovery clock can be acquired based on the already stored position data, and a correct recovery clock can be stably output.

Moreover, when the edge detection circuit 42 is disposed in this manner, and the recovery clock is output based only on the position data whose edge has been detected, the average value of the position data is obtained by the average value calculation circuit 44 described later, and output as the recovery clock. In this case, the recovery clock indicating a correct timing reflecting the actual edge timing of the output data can be output.

The edge selector 43 is switching means connected to the edge detection circuit 42, and selectively switches the trigger signals input into the respective registers 41a to 41n via the pulser 42a of the edge detection circuit 42, and the strobe output from the delay circuit 32 of the time interpolator 30.

In a case where the only position data whose edge has been detected is stored in the register as the reference of the recovery clock by the control of the above-described edge detection circuit 42, and in a case where any edge of the position data is not detected over several clocks, the position data that can be acquired decrease, and a period in which the position data can be acquired is not constant.

Then, in the present embodiment, the edge selector 43 constituting signal switching means is disposed in such a manner that the strobes output at the predetermined timings can be input into the registers 41a to 41n, and the predetermined position data can be successively output to acquire the recovery clock regardless of the presence of the edge of the acquired position data.

Concretely, the edge selector 43 switches a mode (① Edge Sync Mode shown in FIG. 2) to input the trigger signal output from the pulser 42a of the above-described edge detection circuit 42, and a mode (similarly ② Continuously Mode) to input the strobe output from the delay circuit 32 of the time interpolator 30 as a timing signal (trigger signal) for outputting the position data stored in the registers 41a to 41n.

Moreover, this edge selector 43 is switched, and the strobe of the delay circuit 32 is selected (② Continuously Mode). Accordingly, the strobe signals output from the delay circuit 32 of the time interpolator 30 at the predetermined timing are input into the registers 41a to 41n, and the position data can be output from the respective registers 41a to 41n regardless of the presence of the edge detection. In this Continuously Mode, since any enable signal is not input into the register 41a of the forefront stage, the position data stored in the register 41a is held as it is, and the position data output from the previous-stage registers 41a to 41n-1 are stored in the registers 41b to 41n of and after the subsequent stage.

Therefore, the position data of the respective registers 41a to 41n are successively stored and output in a case where the edge of the position data is detected in the same manner as in the above-described edge detection circuit 42, and the already stored position data of the previous cycle is successively output and stored in the register of the next stage in a case where any edge of the position data is not detected.

As a result, in this Continuously Mode, the position data indicating the edge timing is successively output at the timing of the strobe of the delay circuit 32 regardless of the presence of the edge detection of the position data.

The edge selector 43 is disposed in the present embodiment in this manner, and accordingly it can be selected so that any position data is not output from the register 41 as the reference of the recovery clock (Edge Sync Mode), or so that the position data of the previous cycle stored in the register is output (Continuously Mode) in a case where any edge of the position data from the time interpolator 30 is not detected. Accordingly, by the use of the only actual edge timing of the output data of the LSI to be measured, the only position data whose edge has been detected is selected (Edge Sync Mode), when a stricter function test, jitter analysis or the like is performed. In a case where a logic test is performed to inspect the output data itself of the LSI to be measured from the average value of a certain period, the already stored position data of the previous cycle is also used (Continuously Mode). In this manner, it is possible to selectively adopt the position data in accordance with the test content and the like.

The average value calculation circuit 44 inputs the position data output from the plurality of registers 41a to 41n, calculates the average value of the edge timings indicated by the respective position data, and outputs the average value as the recovery clock.

Concretely, the average value calculation circuit 44 comprises: an addition circuit 44a which inputs the position data output from the registers 41a to 41n and adds up all the position data; and a division circuit 44b which divides the addition results of the addition circuit 44a by a register number (n).

Since this average value calculation circuit 44 is disposed, the average value of the plurality of position data stored in the respective registers 41a to 41n is calculated, and the average value can be output as the recovery clock.

Accordingly, the recovery clock can be obtained as correct and proper timing signals reflecting the edge timings of the actual output data of each LSI to be measured and the multiplexed clock. Even in a case where any edge of the output data is not detected, or the output data fluctuates by the jitter, it is possible to acquire a more correct recovery clock based on the average value.

The average value selector 45 is switching means for selecting one of the average value output from the average value calculation circuit 44 and the position data output from one of the plurality of registers 41 to output the recovery clock.

Concretely, in the present embodiment, the average value selector 45 is selectively connected to the output side of the average value calculation circuit 44 and the output side of the register 41a of the forefront stage, and it can be switched to output the average value of the above-described plurality of position data (① Smoothing Mode shown in FIG. 2) or to output the position data output from the register 41a of the forefront stage, that is, the position data acquired in the present test cycle (similarly ② Continuously Mode).

Accordingly, the position data output from the specific register (register 41a of the forefront stage in the present embodiment) and the average value of the position data of the plurality of registers can be selectively output as the recovery clock output from the digital filter 40, and it is possible to selectively use the recovery clock in accordance with the test contents and the like. The average value of the plurality of registers is output as the recovery clock (Smoothing Mode), for example, in a case where the function test is performed in consideration of the timing fluctuation by the jitter of the output data of the LSI to be measured. The position data output from one register (register 41a of the forefront stage) among the plurality of registers is used as the recovery clock (Smoothing Mode) in a case where the logic test is performed to inspect the output data itself of the LSI to be measured regardless of the timing fluctuation by the jitter. The recovery clock can be selectively used in this manner.

The timing correction circuit 46 adds the predetermined correction value to the position data output via the average value selector 45, and corrects the edge timing indicated by the position data to output the recovery clock.

Concretely, as shown in FIG. 2, the timing correction circuit 46 is connected to the output side of the average value selector 45, and adds the predetermined correction value stored in a correction value register (Tsd Thd Reg) 46a to the position data output from the average value selector 45.

The position data output from the timing correction circuit 46 is a recovery clock finally output from the digital filter 40.

The correction value stored in the correction value register 46a is a setting value which sets the setup time and the holding time of the output data of the LSI 1 to be measured in the present embodiment. In general, the setup time and the holding time of the output data with respect to the clock need to be considered in order to stably acquire the output data by the clock signal. Therefore, in the present embodiment, the correction value indicating the set value of the setup time and the holding time is stored in the correction value register 46a, and the set value of the setup time or the holding time can be added to the position data output from one register (register 41a of the forefront stage) or the average value of the position data of all the registers 41a to 41n in the timing correction circuit 46.

Here, the set value of the setup time or the holding time can be set in accordance with the resolution of the level data acquired by the time interpolator 30.

For example, when the output data of the LSI 1 to be measured is acquired by eight bits of strobes, the data can be set as a value for shifting the edge timing of the position data by the arbitrary number of bits in a range of the eight bits of strobes. Concretely, "+1", "−2", or the like can be set as the set value, and the edge timing of the position data can be delayed by one bit, advanced by two bits, or corrected otherwise, for example, in a range of eight bits of strobes by this set value.

Accordingly, in the present embodiment, the recovery clock corrected into a proper edge timing taking into account the setup time or the holding time of the output data can be output.

The recovery clock output from this timing correction circuit 46 is input as the selection signal into the selector 50, and the time-series level data output from the time interpolator 30 can be acquired by the recovery clock corrected into a more proper timing.

The selector 50 is a selection circuit which inputs the time-series level data output from the flip-flops 31a to 31n of the time interpolator 30 as input data and which inputs the recovery clock output from the digital filter 40 as a selection signal. Moreover, the circuit selects the output data of the LSI 1 to be measured at the edge timing of the clock multiplexed onto the output data, and output the data as data to be measured for judging whether the LSI 1 to be measured passes/fails.

Concretely, the selector 50 is constituted of a multiplexer and the like, and connected to the plurality of flip-flops 31a to 31n on a data input side, and a selection signal terminal thereof is connected to the output side of the timing correction circuit 46 of the digital filter 40. Accordingly, in the selector 50, one data among the time-series level data input as the input data from the flip-flops 31a to 31n is selected using the recovery clock as the selection signal.

Moreover, the output data of the LSI 1 to be measured selected by the selector 50 is output to the pattern comparison unit 14, and compared with a predetermined expected value by the pattern comparison unit 14, and the comparison result is output.

As described above, in the present embodiment, the output data of the LSI 1 to be measured at the edge timing indicated by the recovery clock output from the digital filter 40 can be taken in, and a source synchronous function can be realized capable of taking out the clock signal multiplexed onto the output data of the LSI 1 to be measured, and taking in (punching out) the output data of the LSI to be measured at the proper timing of the recovery clock which is not influenced by the presence of the edge of the output data or the jitter.

Therefore, the LSI tester 10 according to the present embodiment can be used as a test device for the function test of the LSI 1 to be measured. Especially, a function test of a clock/data multiplexed type LSI such as SERDES in which the clock is multiplexed onto the output data and output can be easily and correctly performed, although it has heretofore been difficult or impossible to perform the test.

[Source Synchronous Operation]

Next, a source synchronous operation will be described in which output data is acquired at a timing of a multiplexed clock in a clock recovery circuit of a semiconductor test device according to the present embodiment constituted as described above.

First, a predetermined test pattern signal is input into an LSI 1 to be measured from a pattern generation unit 11 and a waveform forming unit 12 (see FIG. 1) disposed in an LSI tester 10, predetermined output data corresponding to a pattern signal is output from the LSI 1 to be measured. It is to be noted that in the present embodiment, the LSI 1 to be measured constitutes a clock/data multiplexed type LSI, and therefore the output data output corresponding to the pattern signal is output data onto which the clock is multiplexed.

The output data output from the LSI 1 to be measured is input into each clock recovery circuit 20 connected to each output terminal.

The output data input into each clock recovery circuit 20 is input into a level comparator 13, compared with a level of a comparison voltage, and thereafter input into a time interpolator 30 (see FIG. 2).

The signal (output data onto which the clock is multiplexed) input into the time interpolator 30 is first input into a plurality of flip-flops 31*a* to 31*n* connected in parallel.

Moreover, strobes are input into clock terminals of the respective flip-flops 31*a* to 31*n* into which the output data are input at constant timing intervals by a delay circuit 32.

Accordingly, the input output data is acquired and output as time-series level data from the respective flip-flops 31*a* to 31*n*.

The time-series level data output from the flip-flops 31*a* to 31*n* are first input into an encoder 34 via XOR circuits 33*a* to 33*n*, and encoded.

The level data encoded by the encoder 34 is position data indicating the edge timing (rising edge or falling edge) of the clock multiplexed onto the output data. Moreover, this position data is input into a digital filter 40, and acquired as a recovery clock corrected into a proper timing.

Moreover, the time-series level data output from the flip-flops 31*a* to 31*n* are input as input data into a selector 50 as such.

In the digital filter 40, the position data output from the encoder 34 are input into a register 41*a* of a forefront stage, and successively input into registers 41*b* to 41*n* of the next stages.

First, the position data is input into an edge detection circuit 42 to detect the presence of an edge. At this time, by the switching of an edge selector 43, one of a mode (① Edge Sync Mode shown in FIG. 2) in which an enable signal output from the edge detection circuit 42 is input as a timing signal (trigger signal) for outputting the position data stored in the registers 41*a* to. 41*n*, and a mode (similarly ② Continuously Mode) in which a strobe signal output from the delay circuit 32 of the time interpolator 30 is input is selected.

When the Edge Sync Mode is selected, the edge detection circuit 42 inputs the position data from the encoder 34 to detect the presence of the edge, and inputs the enable signal into the register 41*a* of the forefront stage in a case where the edge is detected. Accordingly, the only position data whose edge has been detected is stored in the register 41*a* of the forefront stage.

Moreover, the edge detection circuit 42 converts the enable signal into a trigger signal via a pulser 42*a*, inputs this trigger signal into each of the registers 41*a* to 41*n*, and outputs the position data stored in the respective registers 41*a* to 41*n*.

Accordingly, among the position data acquired by the time interpolator 30, the only position data whose edge indicating the signal change point has been detected is successively stored as the position data constituting the reference of the recovery clock in the registers 41*a* to 41*n*, and output. When any edge of the position data is not detected, the edge of the position data is detected in the subsequent cycle, and accordingly the position data stored in the respective registers 41*a* to 41*n* are output.

On the other hand, when Continuously Mode is selected, strobe signals are input into registers 41*a* to 41*n* from the delay circuit 32 of the time interpolator 30 regardless of the presence of edge detection in the edge detection circuit 42.

Moreover, when the edge of the position data is detected in the respective registers 41*a* to 41*n*, the position data are successively stored and output in the same manner as in the above-described edge detection circuit 42. When any edge of the position data is not detected, the already stored position data of the previous cycle is output and stored into the register of the next stage.

As a result, in Continuously Mode, the position data indicating the edge timing is continuously output, stored in the respective registers 41*a* to 41*n*, and output at the timing of the strobe of the delay circuit 32 regardless of the presence of the edge detection of the position data.

The position data output from the registers 41*a* to 41*n* are input into an average value calculation circuit 44 to calculate an average value of the edge timings indicated by the respective position data.

Moreover, by the switching of an average value selector 45, it is switched to output the average value output from the average value calculation circuit 44 (① Smoothing Mode) or to output the position data output from the register 41*a* of the forefront stage as such (② Sampling Mode), and one of the position data is output to a timing correction circuit 46.

The timing correction circuit 46 adds set values (correction values) of a setup time or a holding time stored in a correction value register 46*a*, and outputs position data as a recovery clock corrected into a proper edge timing.

Moreover, the recovery clock output from this timing correction circuit 46 is input as a selection signal into a selector 50.

The selector 50 selects one data from the time-series level data indicating the output data of the LSI 1 to be measured using the recovery clock constituted of the position data of the proper edge timing as the selection signal, and outputs the data as data to be measured for judging whether the LSI 1 to be measured passes/fails.

The output data output from the selector 50 is input into the pattern comparison unit 14, and compared with predetermined expected value data output from the pattern generation unit in the tester, and the comparison result is output.

Moreover, it is detected whether the output data agrees/disagrees with the expected value by the comparison result to judge whether or not the LSI 1 to be measured is satisfactory (Pass/Fail). That is, judgment of Pass is performed when the output of the selector 50 agrees with the expected value, and judgment of Fail is performed in the case of disagreement.

EXAMPLE

A concrete example will be described hereinafter with reference to FIG. 2.

Figure 3:
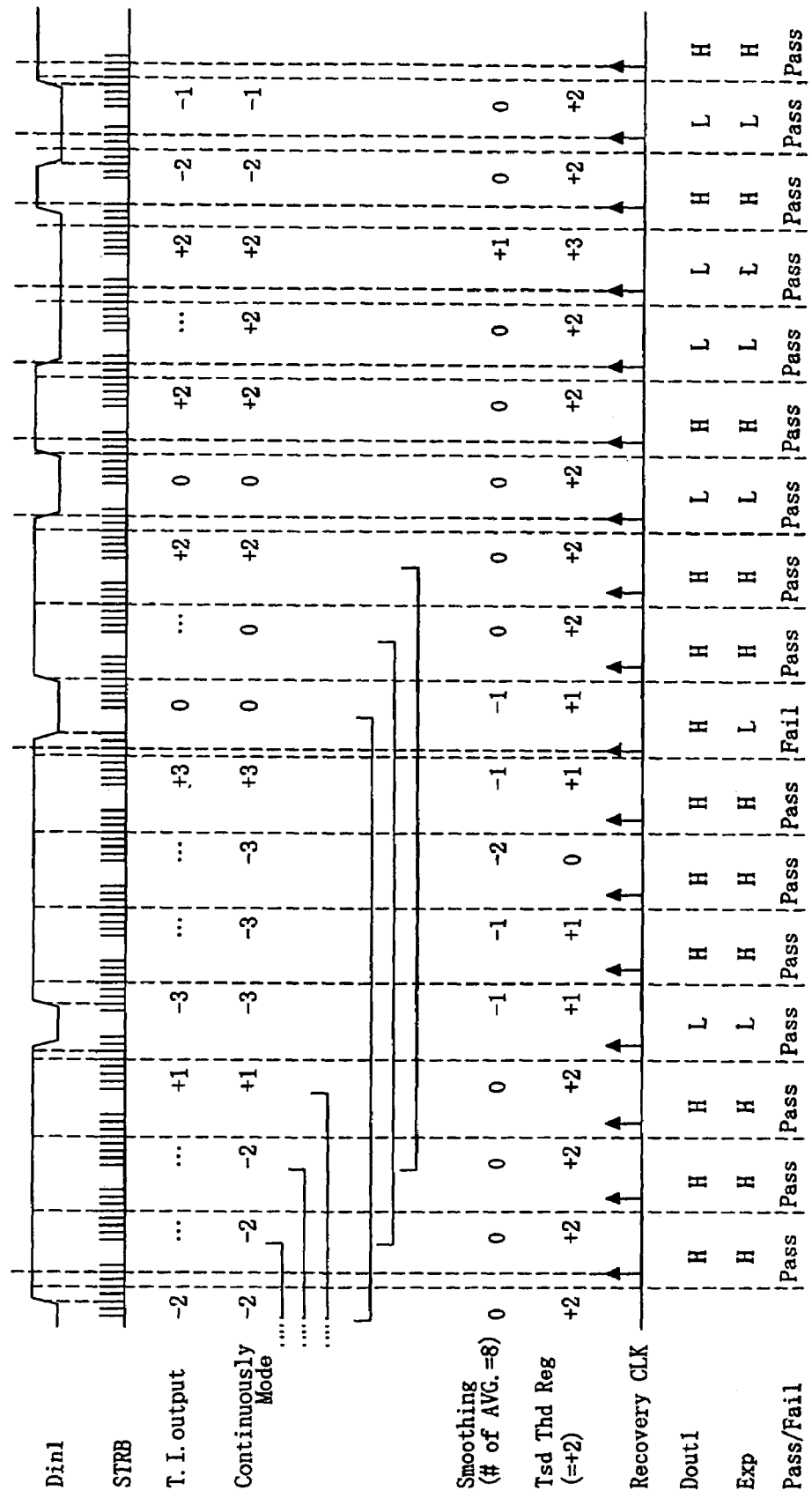
FIG. 3 is a timing chart showing one example in a case where output data of an LSI to be measured is acquired at a timing of a multiplexed clock in the clock recovery circuit of the semiconductor test device according to the first embodiment of the present invention.

FIG. 3 is a timing chart showing one example in a case where output data of an LSI to be measured is acquired at a timing of a multiplexed clock in a clock recovery circuit of a semiconductor test device according to the present embodiment.

The example shown in this figure is a case where a time interpolator 30 of each clock recovery circuit 20 comprises eight flip-flops 31a to 31n, and acquires output data output from an LSI 1 to be measured as level data having a bit number "8". Therefore, a selector 50 which selects this output data comprises an 8-1 type MUX or the like. The time interpolator 30 comprises seven XOR circuits 33a to 33n, inputs seven bits of level data into an encoder 34, and outputs three bits of position data.

Moreover, a digital filter 40 of each clock recovery circuit 20 comprises eight registers 41a to 41n, an edge selector 43 is switched to Continuously Mode, and an average value selector 46 is switched to Smoothing Mode.

First, with regard to output data (Din1 shown in FIG. 3) output from the LSI 1 to be measured, edge timings are acquired by eight bits of strobes (STRB shown in FIG. 3) by eight flip-flops 31a to 31n.

In the example shown in FIG. 3, the edge timing at which the output data turns to "H" from "L", or the edge timing at which the data turns to "L" from "H" is in the following position on the basis of fifth bit of eight bits of strobes (see Din1 of FIG. 3).

"−2"→"no edge"→"no edge"→"+1"→"−3"→"no edge"→"no edge"→"+3"→ . . . .

Moreover, these output data are first input into flip-flops 31a to 31n, and, for example, level data of "01111111" (fifth cycle of FIG. 3: "H" from a position of bit number "−3") or level data of "11110000" (ninth cycle of FIG. 3: "L" from a position of bit number "0") is acquired.

This level data is converted, for example, into "0000001" or "0001000" in the XOR circuits 33a to 33n, further inputs into the encoder 34, and encoded into position data (e.g., "001") indicating the bit number "−3" or position data (e.g., "100") indicating the bit number "0".

Accordingly, timing data output from the time interpolator 30 is as follows (see T.I. output shown in FIG. 3).

"−2"→" . . . "→" . . . "→"+1"→"−3"→" . . . " →" . . . "→"+3"→ . . . .

This timing data is successively input into the registers 41a to 41n of the digital filter 40.

Since Continuously Mode is selected by the edge selector 43 in the digital filter 40, the position data is output in a case where the edge of the position data is detected, the position data of the previous cycle is output in a case where any edge is not detected, and the following position data are successively stored into the registers 41a to 41n from the register 41a of the forefront stage, and output (see Continuously Mode shown in FIG. 3).

"−2"→"−2"→"−2"→"+1"→"−3"→"−3"→"−3"→"+3"→ . . . .

Moreover, since the average value selector 46 selects Smoothing Mode in the digital filter 40, an average value of eight position data output from eight registers, that is, edge timings indicated by data of eight cycles before the existing test cycle is calculated, and the average value is output as follows (Smoothing (# of AVG.=8) shown in FIG. 3).

"0"→"0"→"0"→"0"→"−1"→"−1"→"−2"→"−" → . . . .

In the example shown in FIG. 3, when two bits in eight bits of strobes are added up as the setup time, the corrected position data is as follows (see TsdThdReg (=+2) shown in FIG. 3).

"+2"→"+2"→"+2"→"+2"→"+1"→"+1"→"0"→"+1"→ . . . .

Moreover, the corrected position data is output as the recovery clock (RecoveryCLK shown in FIG. 3), and input into the selector 50.

In the selector 50, for example, level data of "01111111" ("H" from the position of bit number "−3") or level data of "11110000" ("L" from the position of bit number "0") output from the flip-flops 31a to 31n of the time interpolator 30 are input into input terminals.

Moreover, the recovery clock is input as a selection signal into the selector 50 from the digital filter 40.

Accordingly, in the selector 50, data of the input terminal corresponding to the bit number "+2" indicated by the recovery clock is selected (punched out), for example, in a first cycle shown in FIG. 3 using the recovery clock as the selection signal, and, as a result, data of "H" is output from the selector 50 (Dout1 shown in FIG. 3).

Moreover, data (Dout1 shown in FIG. 3) output from the selector 50 is compared with a predetermined expected value (Exp shown in FIG. 3) in the pattern comparison unit 14, and the result is stored in a failure analysis memory 15 (Pass/Fail shown in FIG. 3).

A flow of data is shown in Table 1 in which data of the first cycle shown in FIG. 3 is selected by the selector 50.

TABLE 1

| Edge timing of output data (position of signal change point) | Recovery clock (selection signal) | Selector input (output data) | Selector output |
|---|---|---|---|
| "−2" | "+2" (110) | "no edge" (000) | 0 |
|  |  | "−3" (001) | 0 |
|  |  | "−2" (010) | 1 |
|  |  | "−1" (011) | 1 |
|  |  | "0" (100) | 1 |
|  |  | "+1" (101) | 1 |
|  |  | "+2" (110) | 1 | 1 |
|  |  | "+3" (111 | 1 |

Here, in the eighth cycle shown in FIG. 3, the output data ("H") acquired and output at the timing of the bit number "+1" shown by the recovery clock indicates "Fail" with respect to the expected value data ("L").

This is a setup error generated in a case where a jitter of the output data of this cycle increases, and the edge timing of the output data is larger than the recovery clock.

When the output data is taken in (punched out) by the recovery clock indicating a proper timing in this manner, the setup error generated in the case of fluctuation of the output data by the jitter can be detected.

It is to be noted that in the present example, when the set value ("+2") of the setup time is added as the correction value of the recovery clock, the setup error can be detected. However, when the set value of the holding time is added as the correction value, the recovery clock is delayed on a holding side, and a holding error of the output data may be detected.

Needless to say, not only the timing error but also a logic error in which logic of the output data is clearly different from that of the expected value data can be judged.

As described above, according to the semiconductor test device of the present embodiment, first the clock recovery circuit 20 having the source synchronous function comprises the time interpolator 30, and accordingly the output data onto which the clock output from the LSI 1 to be measured is multiplexed can be acquired as the time-series level data.

This time-series level data indicates the edge timing which is the signal change point of the output data of the LSI 1 to be measured, and this edge timing indicates the edge timing of the clock multiplexed onto the output data.

Therefore, when the output data of the LSI 1 to be measured is input into the time interpolator 30, and the level data and position data indicating the edge timing are acquired, the clock multiplexed onto the output data can be taken out.

Moreover, when the clock recovery circuit 20 further comprises the digital filter 40 in the present embodiment, the position data output from the time interpolator 30 is held and stored, and the recovery clock corrected into the correct and proper edge timing can be output. That is, when the position data acquired by the time interpolator 30 is input and held in the digital filter 40, the recovery clock corrected into the timing correctly and properly indicating the edge timing of the multiplexed clock can be output.

Accordingly, even when any edge of the output data of the LSI 1 to be measured is not detected, or the output data fluctuates by the jitter, the recovery clock indicating the edge timing of the multiplexed clock can be output.

Moreover, the present embodiment comprises the selector 50 for inputting the recovery clock as the selection signal, and accordingly the time-series level data acquired by the time interpolator 30 is punched out at the timing of the recovery clock, and can be output as the data to be measured for judging pass/fail, which is to be compared with the predetermined expected value data.

Accordingly, it is possible to realize the source synchronous function capable of taking out the clock signal multiplexed on the output data of the LSI 1 to be measured and taking in the output data of the LSI 1 to be measured at the proper timing of the recovery clock which is not influenced by the presence of the edge of the output data or the jitter.

Therefore, the LSI tester 10 according to the present embodiment can be used as the test device for the function test of the LSI 1 to be measured, and can easily and correctly perform even a function test of a clock/data multiplexed type LSI such as SERDES in which the clock is multiplexed onto the output data and output, although it has heretofore been difficult or impossible to perform the test.

Moreover, in the present embodiment, the time interpolator 30 and the digital filter 40 constituting the clock recovery circuit 20 can be easily constituted using existing means such as a sequential circuit or delay circuit, an encoder, and a register. Accordingly, the LSI tester 10 can be realized by a simple constitution without complicating or enlarging the tester or raising costs.

Furthermore, according to the clock recovery circuit of the present invention comprising the sequential circuit, the delay circuit, and register in this manner, when the number of the sequential circuits or the registers, or the delay amount of the delay circuit is arbitrarily changed, the bit width (the number of the sequential circuits and the registers) or the resolution (the delay amount of the delay circuit) of the time-series level data or the position data in the time interpolator and the digital filter can be set to a desired value. Accordingly, various settings are possible in accordance with a data rate, a jitter width and the like, and it is possible to realize a semiconductor test device which can handle any LSI and which has high general-purpose properties and convenience.

Second Embodiment

Next, a second embodiment of a semiconductor test device according to the present invention will be described with reference to FIG. 4.

Figure 4:
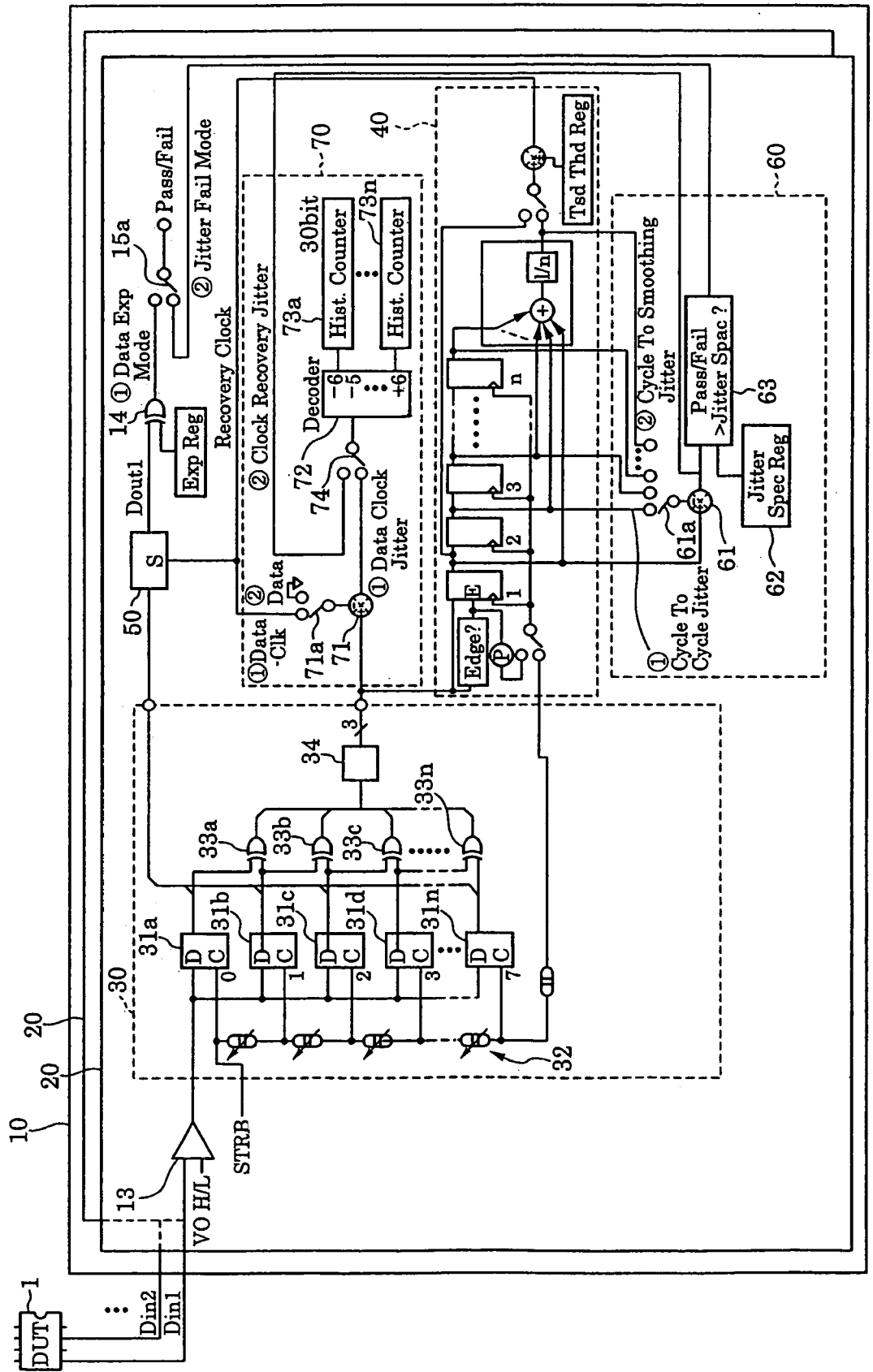
FIG. 4 is a block diagram showing details of the clock recovery circuit disposed in the semiconductor test device according to a second embodiment of the present invention.

FIG. 4 is a block diagram showing details of a clock recovery circuit disposed in the semiconductor test device according to a second embodiment of the present invention.

As shown in the figure, the semiconductor test device according to the present embodiment is a modification of the above-described first embodiment, and a clock recovery circuit 20 in the first embodiment further comprises a jitter detection circuit 60 and a jitter distribution circuit 70.

Therefore, other constituting parts are similar to those of the first embodiment, the similar constituting parts are denoted with the same reference numerals as those of the first embodiment in the drawing, and detailed description is omitted.

[Jitter Detection Circuit]

A jitter detection circuit 60 inputs position data which are references of recovery clocks output from registers 41a to 41n of a digital filter 40, and detects a phase difference between edge timings indicated by the position data to thereby acquire and analyze the phase difference as a jitter of output data of an LSI 1 to be measured.

Concretely, the jitter detection circuit 60 comprises a subtraction circuit 61, a jitter limit value register 62, and a comparison judgment circuit 63.

The subtraction circuit 61 inputs two contrast position data from the digital filter 40, and calculates a phase difference between the edge timings indicated by the respective position data.

The position data (recovery clock) acquired by the digital filter 40 indicates the edge timing of the output data of the LSI 1 to be measured, subjects the position data to subtraction, and can acquire the phase difference between the position data, that is, a jitter width of the output data of the LSI 1 to be measured.

For example, when the output data output from the LSI 1 to be measured is acquired by eight bits of strobes (see FIG. 3), eight types "no edge, −3, −2, −1, 0, +1, +2, +3" of the position data indicating the edge timings are acquired. When the position data are subjected to the subtraction, acquired phase difference data are 13 types "−6, −5, −4, −3, −2, −1, 0, +1, +2, +3, +4, +5, +6".

Moreover, when position data indicating, for example, that the position of the edge timing is bit number "−2", and position data indicating bit number "+1" are input into the subtraction circuit 61, and these position data are subjected to the subtraction, the following results:

"+1"−"−2"="+3", and a phase difference of "+3" of the position data is calculated.

The phase difference calculated in the subtraction circuit 61 in this manner indicates the jitter width of the output data of the LSI 1 to be measured, the phase difference is acquired, and accordingly jitter analysis of the LSI 1 to be measured is performed.

Here, in the present embodiment, the subtraction circuit 61 is connected to the output side of the register 41*a* of the forefront stage of the digital filter 40, and is selectively connected to one of output sides of subsequent-stage registers 41*b* to 41*n* and average value calculation circuit 44 via a jitter selector 61*a*.

Accordingly, a case where the position data output from the register 41*a* of the forefront stage, and the position data of one of the subsequent-stage registers 41*b* to 41*n* are input into the subtraction circuit 61, and subjected to the subtraction (① Cycle To Cycle Jitter shown in FIG. 4), and a case where the position data of the register 41*a* of the forefront stage, and the position data indicating the average value calculated by the average value calculation circuit 44 are subjected to the subtraction (② Cycle To Smoothing Jitter shown in FIG. 4) can be switched.

The jitter limit value register 62 stores a predetermined jitter limit value to be compared with the phase difference calculated by the subtraction circuit 61.

The comparison judgment circuit 63 compares the phase difference calculated by the subtraction circuit 61 with the jitter limit value stored in the jitter limit value register 62 to judge satisfactoriness (Pass/Fail). For example, "Fail" is judged in a case where the phase difference calculated by the subtraction circuit 61 exceeds the jitter limit value, and "Pass" is judged in a case where the difference does not exceed the jitter limit value.

Moreover, the judgment result of the comparison judgment circuit 63 is stored in the failure analysis memory 15 (see FIG. 1) in the same manner as in the pass/fail judgment result in the pattern comparison unit 14 described in the first embodiment.

It is to be noted that in the present embodiment, as shown in FIG. 4, an input section into the failure analysis memory 15 comprises a judgment selector (JudgeSel) 15*a*, and a mode (① Data Exp Mode shown in FIG. 4) in which the pass/fail judgment result in the pattern comparison unit 14 is stored in the failure analysis memory 15, and a mode (similarly ② Jitter Fail Mode) in which the judgment result of the comparison judgment circuit 63 is stored can be switched.

[Jitter Distribution Circuit]

A jitter distribution circuit 70 inputs position data output from a time interpolator 30, and a corresponding recovery clock output from a digital filter, detects a phase difference between edge timings indicated by the position data and the recovery clock, acquires a distribution of the phase differences, and output distribution data of jitters of output data of an LSI 1 to be measured.

Moreover, the jitter distribution circuit 70 inputs the phase difference between recovery clocks, detected by the jitter detection circuit 60, acquires a distribution of the phase differences, and outputs distribution data of jitters of output data of the LSI 1 to be measured.

Concretely, the jitter distribution circuit 70 comprises: a subtraction circuit 71; a decoder 72; and counters 73 (73*a* to 73*n*).

The subtraction circuit 71 inputs two position data to calculate the phase difference between the edge timings indicated by the respective position data in the same manner as in the subtraction circuit 61 of the jitter detection circuit 60.

Here, as shown in FIG. 4, this subtraction circuit 71 is connected to the output side of the encoder 34 of the time interpolator 30, and is selectively connected to the output side of the digital filter 40 via a data/clock selector 71*a*.

Accordingly, in the subtraction circuit 71, a case (① Data-Clk shown in FIG. 4) where the position data output from the encoder 34 of the time interpolator 30, and the recovery clock output from the digital filter 40 are subjected to the subtraction, and a case (② Data shown in FIG. 4) where the only position data of the time interpolator 30 is output as such can be selectively switched.

The decoder 72 inputs predetermined position data via a jitter distribution selector 74, decodes the data into time-series level data, and outputs the data.

The counter 73 (73*a* to 73*n*) is disposed for each output terminal of the decoder 72, and output signals of the decoder 72 are counted for each output terminal.

Moreover, the distribution of the jitters of the output data of the LSI 1 to be measured, or the distribution of the edge timings can be acquired from a plurality of data output from the counters 73*a* to 73*n*.

Here, as to the position data input into the decoder 72, as shown in FIG. 4, a case (① Data Clock Jitter shown in FIG. 4) where the position data from the subtraction circuit 71 is input via the jitter distribution selector 74, and a case (② Clock Recovery Jitter shown in FIG. 4) where the position data from the subtraction circuit 61 of the jitter detection circuit 60 is input are selectively switched.

Therefore, there are the following four patterns of the position data input into the decoder 72 by a combination of selection of the data/clock selector 71*a* and the jitter distribution selector 74 (see FIG. 5):

(1) a case where position data indicating a phase difference between the position data output from the encoder 34 of the time interpolator 30 and the recovery clock output from the digital filter 40 is input (① Data-Clk and (① Data Clock Jitter);

(2) a case where the only position data output from the encoder 34 of the time interpolator 30 is input as such (② Data and ① Data Clock Jitter);

(3) a case where position data indicating a phase difference between the position data output from the register 41*a* of the forefront stage of the digital filter 40 and the position data of one of the subsequent-stage registers 41*b* to 41*n* is input (② Clock Recovery Jitter and ① Cycle To Cycle Jitter); and (4) a case where position data indicating a phase difference between the position data of the register 41*a* of the forefront stage of the digital filter 40 and the position data indicating the average value calculated by the average value calculation circuit 44 is input (② Clock Recovery Jitter and ① Cycle To Smoothing Jitter).

Moreover, when the predetermined position data is input into the decoder 72 in this manner, concretely, the distribution of the edge timings indicated by the position data is acquired as follows.

First, as the case (the above case (2)) where the only position data of the time interpolator 30 is input as such, for example, in the same manner as in the above-described first embodiment, the output data output from the LSI 1 to be measured is acquired by eight bits of strobes, and the position data indicating the edge timing is output as three bits of position data from the encoder 34. In this case, data indicating edge timings can be acquired in the decoder 72 as shown in the following table 2, and data can be counted for each output terminal in the counter 73.

TABLE 2

| Edge timing of output data (position of signal change point) | Encoder output (three bits) | Decoder output (seven bits) |
|---|---|---|
| "no edge" | 000 | 0000000 |
| "−3" | 001 | 0000001 |
| "−2" | 010 | 0000010 |
| "−1" | 011 | 0000100 |
| "0" | 100 | 0001000 |
| "+1" | 101 | 0010000 |
| "+2" | 110 | 0100000 |
| "+3" | 111 | 1000000 |

As shown in this table 2, the data output from the decoder 70 is "H" only in the output terminal indicating the signal change point of the output data of the LSI 1 to be measured, and is "L" in the other output terminals.

Therefore, when the output signals of this decoder 72 are counted for each output terminal of the decoder 72 by the counters 73a to 73n, the clock of the LSI 1 to be measured or the distribution of the edge timing of the output data can be acquired.

Next, in the case (in the above case (1)) where the position data indicating the phase difference between the position data of the time interpolator 30 and the recovery clock of the digital filter 40 is input, or in the case (in the above case (3) or (4)) in which the position data indicating the phase difference between the position data of the register 41a of the forefront stage of the digital filter 40 and the position data of one of the subsequent-stage registers 41b to 41n or the average value of the average value calculation circuit 44 is input, for example, as described above, the output data output from the LSI 1 to be measured is acquired by seven bits of strobes, and the position data indicating the edge timing is subjected to the subtraction to acquire 13 types "−6 to +6" of phase differences.

Therefore, as shown in the following table 3, when the decoder 72 comprising 13 output terminals is used, the data indicating the phase difference is acquired, and the data can be counted for each output terminal by the counter 73.

TABLE 3

| Phase difference | Decoder output (13 bits) |
|---|---|
| "−6" | 0000000000001 |
| "−5" | 0000000000010 |
| "−4" | 0000000000100 |
| "−3" | 0000000001000 |
| "−2" | 0000000010000 |
| "−1" | 00000001000000 |
| "+2" | 0000100000000 |
| "+3" | 0001000000000 |
| "+4" | 0010000000000 |
| "+5" | 0100000000000 |
| "+6" | 1000000000000 |

As shown in this table 3, the data output from the decoder 72 is "H" only in the output terminal indicating the position data between the subtracted position data, and is "L" in the other output terminals.

Therefore, when the output signals of this decoder 72 are counted for each output terminal of the decoder 72 by the counters 73a to 73n, the distribution of the phase difference between the output data of the LSI 1 to be measured and the recovery clock or between the recovery clocks can be acquired.

It is to be noted that the number of outputs of the decoder 72 and the number of the counters 73a to 73n which count the outputs of the decoder 72 can be set to arbitrary numbers in accordance with a measurable range (resolution) or the like of the time-series level data which can be acquired by the time interpolator 30.

In this manner, in the semiconductor test device of the present embodiment, by the switching of the edge selector 41 and the average value selector 46 disposed in the digital filter 40, the jitter selector 61a disposed in the jitter detection circuit 60, the data/clock selector 71a and the jitter distribution selector 74 disposed in the jitter distribution circuit 70, and further the judgment selector 15a disposed in the failure analysis memory 15, the function test of the LSI 1 to be measured, the analysis test of the jitter and the like can be performed by arbitrary combinations.

Concretely, by the switching of each selector, various tests can be performed by combinations shown in FIG. 5.

As described above, the semiconductor test device according to the present embodiment comprises the jitter detection circuit 60 which inputs a plurality of recovery clocks to thereby subject the position data indicating the edge timings of the respective recovery clocks to the subtraction, and accordingly the phase difference between the recovery clocks can be detected.

Moreover, the jitter distribution circuit 70 which inputs the phase difference detected by the jitter detection circuit 60 is disposed to thereby acquire the distribution of the phase difference, and the data can be output as the distribution data indicating the fluctuation or spread of the phase difference.

The phase difference between the recovery clocks indicates the jitter of the clock signal multiplexed onto the output data of the LSI 1 to be measured, the phase difference between the recovery clocks and the distribution data are acquired, and accordingly it is possible to perform the jitter analysis of the output data of the LSI 1 to be measured and the multiplexed clock.

Furthermore, the semiconductor test device of the present embodiment comprises the jitter distribution circuit 70 to thereby input the phase difference between the recovery clock of the digital filter 40 and the position data of the time interpolator 30, constituting the original position data, and can accordingly acquire and analyze the distribution of the phase difference.

The edge timing indicated by the recovery clock is the position data in which the clock multiplexed onto the output data of the LSI 1 to be measured is corrected into the proper timing, the recovery clock is compared with the original position data to acquire the distribution of the phase difference, and accordingly it is possible to analyze the jitter distribution of the output data of the LSI to be measured in the comparison with the proper recovery clock.

In this manner, in the present embodiment, the jitter analysis of the output data of the LSI to be measured and the clock can be easily, correctly, and securely performed with a high precision without causing problems as in use of an existing jitter measuring unit, such as an error by an operation of an oscilloscope or the like or difficulty in a measuring operation.

The preferable embodiments of the semiconductor test device of the present invention have been described above, but the semiconductor test device according to the present embodiment is not limited to the above-described embodiments, and, needless to say, various modifications are possible in the scope of the present invention.

For example, in the above-described embodiments, the recovery clock integrally comprising the jitter detection circuit and jitter distribution circuit which acquire and analyze the jitter of the LSI to be measured together with the selector for performing the function test of the LSI to be measured has been described, but the selector, jitter detection circuit, and jitter distribution circuit may be separately disposed.

That is, as long as the clock recovery circuit constituting the semiconductor test device of the present invention comprises the time interpolator for acquiring the output data of the LSI to be measured as the time-series level data, and the digital filter for acquiring and outputting the recovery clock based on the level data acquired by the time interpolator, the circuit may be combined with any circuit, device or the like, and applications, purposes or the like of the semiconductor test device are not especially limited.

As described above, a semiconductor test device of the present invention comprises a clock recovery circuit having a source synchronous function capable of taking out a multiplexed clock signal from output data of an LSI to be measured, properly correcting an edge timing of the clock signal, and tuning the timing to the output data. Accordingly, without using any timing signal from the outside, or without disposed any extra output terminal or the like in the LSI to be measured, the clock signal multiplexed onto the output data can be easily and securely acquired, and the output data of the LSI to be measured can be correctly caught by a recovery clock corrected into the proper edge timing.

Accordingly, a function test, jitter analysis or the like of a data/clock multiplexed type LSI device which multiplexes a clock onto output data to output the data, represented by SERDES or the like, can be easily and correctly performed.

The invention claimed is:

1. A semiconductor test device comprising a clock recovery circuit having:
   a time interpolator which receives output data from an LSI device under test and which acquires the output data by timings of a plurality of strobes having constant timing intervals to produce time-series level data and which outputs position data indicating an edge timing of the level data, wherein a clock signal generated by the LSI device under test is superposed on the output data;
   a selector which receives the time-series level data from the time interpolator and selectively provides the time-series level data to a comparator of the semiconductor test device; and
   a digital filter which receives the position data from the time interpolator and produces a recovery clock indicating a correct timing of the clock signal from the LSI device under test created based on the position data for retrieving the output data wherein the recovery clock is supplied to the selector as a selection signal for selecting the time-series level data.

2. The semiconductor test device according to claim 1, wherein the time interpolator comprises:
   a plurality of sequential circuits, connected in parallel, which receive the output data from the LSI device under test; a delay circuit which successively inputs a strobe delayed at a constant timing interval into the plurality of sequential circuits and which outputs time-series level data from the sequential circuits; and an encoder which receives the time-series level data from the plurality of sequential circuits and which encodes the data into the position data indicating an edge timing of the output data of the LSI device under test to output the data, and
wherein the digital filter comprises:
   one or more registers connected in series, which successively store the position data output from the time interpolator and which output the stored position data at a predetermined timing, and the recovery clock indicating the correct timing of the clock signal is produced based on the position data output from the register.

3. The semiconductor test device according to claim 2, wherein the digital filter comprises:
   an edge detection circuit which detects presence of an edge of the position data from the time interpolator and which outputs the position data stored in the register when the edge is detected.

4. The semiconductor test device according to claim 3, wherein the register outputs the stored position data at the predetermined timing regardless of the presence of the edge of the position data detected by the edge detection circuit.

5. The semiconductor test device according to claim 3, wherein the digital filter comprises an edge selector which selects whether or not to output the position data stored in the register regardless of the presence of the edge of the position data detected by the edge detection circuit.

6. The semiconductor test device according to claim 2, wherein in a case where two or more registers are disposed, the digital filter comprises an average value calculation circuit for receiving the position data from the two or more registers, respectively, and calculating an average value of edge timings indicated by the respective position data to output the average value as the recovery clock.

7. The semiconductor test device according to claim 6, wherein the digital filter comprises an average value selector for selecting one of the position data from one of the two or more registers and the average value from the average value calculation circuit to output the recovery clock.

8. The semiconductor test device according to claim 2, wherein the digital filter comprises a timing correction circuit for adding a predetermined correction value to the position data from the register, and correcting the edge timing indicated by the position data to output a corrected recovery clock.

9. The semiconductor test device according to claim 2, further comprising:
   a selection circuit which selects one data from the time-series level data from the time interpolator using the recovery clock from the digital filter as a selection signal to output the data as data to be tested for judging whether the LSI device under test passes or fails.

10. The semiconductor test device according to claim 2, further comprising:
   a jitter detection circuit which receives a plurality of recovery clocks from the digital filter and which detects a phase difference between the edge timings indicated by the respective recovery clocks to acquire the jitter of the output data of the LSI device under test.

11. The semiconductor test device according to claim 10, further comprising:
   a jitter distribution circuit which receives a phase difference of the recovery clock detected by the jitter detection circuit and which acquires distribution of the phase difference to output distribution data of the jitter of the output data of the LSI device under test.

12. The semiconductor test device according to claim 2, further comprising:
   a jitter distribution circuit which receives the position data from the time interpolator and a recovery clock corresponding to the position data from the digital filter and which detects a phase difference between edge timings indicated by the position data and the recovery clock and which acquires distribution of the phase differences to output distribution data of jitters of the output data of the LSI device under test.

* * * * *